(12) United States Patent
Jin (10) Patent No.: US 11,937,345 B2
(45) Date of Patent: Mar. 19, 2024

(54) CERAMIC HEATER (71) Applicant: MiCo Ceramics Ltd., Gyeonggi-do (KR)

(72) Inventor: Jung Chul Jin, Gyeonggi-do (KR)

(73) Assignee: MiCo Ceramics Ltd., Gyeonggi-do (KR)

( * ) Notice: Subject to any disclaimer, the term of this patent is extended or adjusted under 35 U.S.C. 154(b) by 0 days.

(21) Appl. No.: 18/025,039

(22) PCT Filed: Sep. 10, 2020

(86) PCT No.: PCT/KR2020/012244
§ 371 (c)(1),
(2) Date: Mar. 7, 2023

(87) PCT Pub. No.: WO2022/054989
PCT Pub. Date: Mar. 17, 2022

(65) Prior Publication Data
US 2023/0247727 A1 Aug. 3, 2023

(30) Foreign Application Priority Data
Sep. 9, 2020 (KR) .................. 10-2020-0115274

(51) Int. Cl.
*H01L 21/06* (2006.01)
*H01L 21/68* (2006.01)
(Continued)

(52) U.S. Cl.
CPC .......... *H05B 3/143* (2013.01); *H01L 21/683* (2013.01); *H01L 21/68785* (2013.01);
(Continued)

(58) Field of Classification Search
None
See application file for complete search history.

(56) References Cited

U.S. PATENT DOCUMENTS 6,261,708 B1 7/2001 Ohashi et al.
2007/0169703 A1* 7/2007 Elliot .................. C23C 16/4586
156/914

(Continued)

FOREIGN PATENT DOCUMENTS

CN 106653652 A 5/2017
JP H10-273370 A 10/1998
(Continued)

OTHER PUBLICATIONS

International Search Report from corresponding PCT Application No. PCT/KR2020/012244, dated Jun. 4, 2021.
(Continued)

*Primary Examiner* — Joseph M. Pelham
(74) *Attorney, Agent, or Firm* — Harness, Dickey & Pierce, P.L.C.

(57) ABSTRACT

The present invention relates to a ceramic heater. The ceramic heater of the present invention comprises: a heater plate in which a heating element is disposed and which is made of a ceramic material; a shaft which has a tubular shape with a through-hole and is coupled to the bottom surface of the heater plate and in which a rod for supplying power to the heating element through the through-hole is received; and a continuous or discontinuous air pocket which is provided in a joint with which the heater plate and the shaft come into contact and by which the heater plate and the shaft are coupled to each other, wherein the air pocket is formed along the joining surface of the joint.

8 Claims, 8 Drawing Sheets

(51) Int. Cl.
  *H01L 21/683* (2006.01)
  *H01L 21/687* (2006.01)
  *H05B 3/03* (2006.01)
  *H05B 3/06* (2006.01)
  *H05B 3/14* (2006.01)
  *H05B 3/28* (2006.01)
  *H05B 3/74* (2006.01)
  *H01L 21/67* (2006.01)

(52) U.S. Cl.
  CPC ......... *H01L 21/68792* (2013.01); *H05B 3/03* (2013.01); *H05B 3/06* (2013.01); *H05B 3/74* (2013.01); *H01L 21/67103* (2013.01)

(56) References Cited

U.S. PATENT DOCUMENTS

| | | | | |
|---|---|---|---|---|
| 2009/0277388 | A1* | 11/2009 | Lubomirsky | C23C 16/4586 118/725 |
| 2013/0136878 | A1* | 5/2013 | Elliot | H01L 21/68792 228/119 |
| 2014/0014642 | A1* | 1/2014 | Elliot | H01L 21/67103 219/444.1 |
| 2017/0127475 | A1 | 5/2017 | Nagai et al. | |
| 2018/0308722 | A1* | 10/2018 | Umeki | H01L 21/67109 |
| 2020/0075361 | A1* | 3/2020 | Unno | H01L 21/68785 |

FOREIGN PATENT DOCUMENTS

| | | | | |
|---|---|---|---|---|
| JP | 2012-160368 | A | | 8/2012 |
| JP | 2013-012413 | A | | 1/2013 |
| JP | 5460184 | B2 | * | 4/2014 |
| JP | 2016-225015 | A | | 12/2016 |
| JP | 2016-225016 | A | | 12/2016 |
| JP | 2017-085087 | A | | 5/2017 |
| JP | 2017-183609 | A | | 10/2017 |
| JP | 6697363 | B2 | * | 5/2020 ........ H01J 37/32724 |
| JP | 7017967 | B2 | * | 2/2022 |
| JP | 2023023670 | A | * | 2/2023 |
| KR | 20150132515 | A | * | 11/2015 |
| KR | 10-2017-0051310 | A | | 5/2017 |
| TW | 201506989 | A | * | 2/2015 ....... H01L 21/02002 |

OTHER PUBLICATIONS

Notice of Allowance from corresponding Korean Patent Application No. 10-2020-0115274, dated Apr. 9, 2021.
Office Action from corresponding Korean Patent Application No. 10-2020-0115274, dated Dec. 4, 2020.
Office Action from corresponding Chinese Application No. 202080104998.3, dated Aug. 6, 2023.
Notice of Allowance from corresponding Japanese Patent Application No. 2023-515645, dated Sep. 5, 2023.

* cited by examiner

CERAMIC HEATER

CROSS-REFERENCE TO RELATED APPLICATIONS

This application is a national phase application of PCT Application No. PCT/KR2020/012244, filed on Sep. 10, 2020, which claims benefit of Korean Patent Application No. 10-2020-0115274, filed Sep. 9, 2020. The entire disclosure of the applications identified in this paragraph are incorporated herein by reference.

TECHNICAL FIELD

The present disclosure relates to a ceramic heater and, more particularly, to a ceramic heater having a shaft joint structure with reduced heat loss.

BACKGROUND ART

In general, a semiconductor device or a display device is manufactured by sequentially stacking a plurality of thin film layers including a dielectric layer and a metal layer on a glass substrate, a flexible substrate, or a semiconductor wafer substrate and then patterning the thin film layers. These thin film layers are sequentially deposited on the substrate through a chemical vapor deposition (CVD) process or a physical vapor deposition (PVD) process. The CVD process includes a low-pressure chemical vapor deposition (LPCVD) process, a plasma-enhanced CVD (PECVD) process, a metal organic CVD (MOCVD) process, and the like.

Heaters configured to support a glass substrate, a flexible substrate, a semiconductor wafer substrate, and the like and to apply a predetermined level of heat are disposed in such CVD and PVD apparatuses. The heaters are also used for heating a substrate in an etching process of thin film layers provided on a support substrate, a firing process of a photoresist, and the like. As the heaters installed in the CVD and PVD apparatuses, ceramic heaters are widely used in accordance with a demand for precise temperature control, microfabrication of wiring lines of semiconductor elements, and precise heat treatment of semiconductor wafer substrates.

Figure 1:
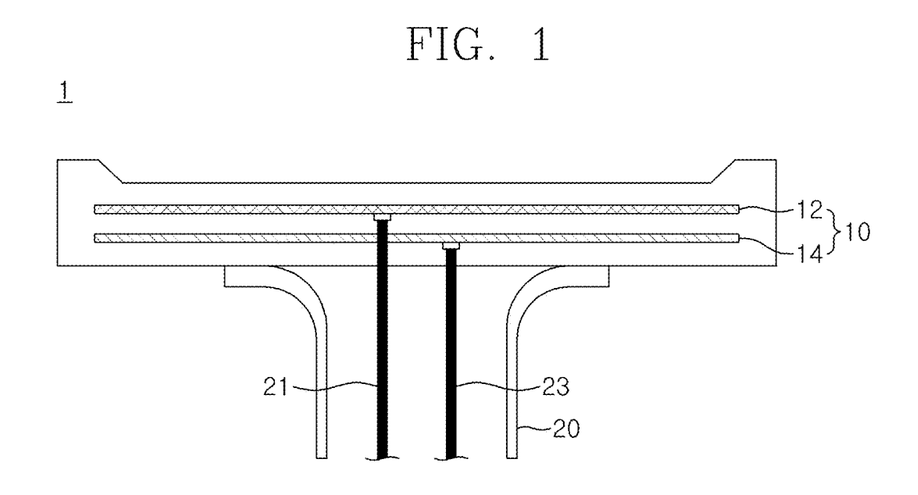
FIG. 1 is a schematic cross-sectional view of a conventional ceramic heater.

As illustrated in FIG. 1, a conventional ceramic heater 1 includes a heater plate 10 coupled to a shaft 20, and the heater plate 10 includes a radio-frequency electrode 12 and a heating element 14 disposed between ceramic materials. The shaft 20 is connected to each of the radio-frequency electrode 12 and the heating element 14 and provides a hole through which rods 21 and 23 configured to supply power pass.

However, in the structure of the conventional ceramic heater 1 illustrated in FIG. 1, since some of the heat generated from the heating element 14 (e.g., 650° C. or higher in some cases) is released via the shaft 20, which is in contact with the bottom surface of the heater plate 10, the heat loss in the heater plate 10 is increased, and the temperature uniformity of a substrate disposed on the ceramic heater 1 is deteriorated.

DISCLOSURE OF INVENTION

Technical Problem

Therefore, the present disclosure has been made to solve the above problems, and the present disclosure provides a ceramic heater in which an air pocket is provided in a joint portion between a heater plate and a shaft to reduce heat loss, reduce leaking in a chamber of a semiconductor apparatus, reduce cracking due to a decrease in thermal stress, and reduce heat loss paths so that thermal efficiency can be increased.

Solution to Problem

The features of the present disclosure may be summarized as follows. In view of the above-described problems, a ceramic heater according to an aspect of the present disclosure may include: a heater plate made of a ceramic material on which a heating element is disposed; a tubular shaft having a through hole, wherein the shaft is coupled to a bottom surface of the heater plate and accommodates a rod configured to supply power to the heating element through the through hole; and a continuous or intermittent air pocket provided in a joint portion where the heater plate and the shaft are abutted on each other to be coupled to each other, wherein the air pocket is provided along joined surfaces in the joint portion.

The ceramic heater further includes a bonding material provided between the heater plate and the shaft along the joined surfaces in the joint portion, and the air pocket includes a groove provided along the bonding material.

As an embodiment, the bonding material may contain 90 to 97 wt % of AlN and 3 to 10 wt % of $Y_2O_3$.

As another embodiment, the bonding material may contain 45 to 75 wt % of AlN, 10 to 20 wt % of $Al_2O_3$, 10 to 20 wt % of CaO, and 5 to 15 wt % of $Y_2O_3$.

The air pocket may include a groove provided in the heater plate along the joined surfaces in the joint portion. The groove may have a T-shaped cross section and may be wider toward the heater plate bonding material than toward the joined surfaces.

The air pocket may be provided at a position corresponding to an arrangement path of the heating element along the arrangement path of the heating element. Here, the ceramic heater may further include a bonding material provided between the heater plate and the shaft along the joined surfaces in the joint portion, and the air pocket may be provided along the bonding material. In addition, the air pocket may be provided in the heater plate along the joined surfaces in the joint portion.

The heater plate may further include a radio-frequency electrode which is spaced apart from the heating element, and the radio-frequency electrode may be configured to receive power via another rod provided in the through hole in the shaft.

Advantageous Effects of Invention

With the ceramic heater according to the present disclosure, heat loss can be reduced by placing an air pocket in the joint portion between the heater plate and the shaft. The air pocket is capable of increasing thermal efficiency by reducing leaking in the chamber of a semiconductor apparatus, reducing cracking due to a decrease in thermal stress, and reducing a heat loss path.

BRIEF DESCRIPTION OF THE DRAWINGS

The accompanying drawings, which are included as a part of the detailed description to help the understanding of the present disclosure, provide embodiments of the present disclosure and illustrate the technical spirit of the present disclosure together with the detailed description.

BEST MODE FOR CARRYING OUT THE INVENTION

Hereinafter, the present disclosure will be described in detail with reference to the accompanying drawings. Herein, like components in each drawing are denoted by like reference numerals if possible. In addition, detailed descriptions of already known functions and/or configurations will be omitted. In the following description, components necessary for understanding operations according to various embodiments will be mainly described, and descriptions of elements that may obscure the gist of the description will be omitted. In addition, some elements in the drawings may be exaggerated, omitted, or schematically illustrated. The size of each component does not entirely reflect the actual size, and therefore, the descriptions provided herein are not limited by the relative sizes or spacings of the components drawn in each drawing.

In describing the embodiments of the present disclosure, when it is determined that a detailed description of the known technology related to the present disclosure may unnecessarily obscure the subject matter of the present disclosure, the detailed description will be omitted. In addition, terms to be described later are defined in consideration of functions in the present disclosure and may vary according to the intention, custom, or the like of a user or operator. Therefore, the definitions of the terms should be made based on the description throughout this specification. Terms used in the detailed description are only for describing the embodiments of the present disclosure, and should not be treated as limiting. Unless expressly used otherwise, singular forms of expressions include the meanings of plural forms of expressions. In this description, expressions such as "including" or "comprising" are intended to indicate any features, numbers, steps, operations, elements, or some or combinations thereof, and should not be construed to exclude the existence or possibility of one or more other features, numbers, steps, operations, elements, or some or combinations thereof.

In addition, terms such as "first" and "second" may be used to describe various components, but the components are not limited by the terms, and these terms are only used for the purpose of distinguishing one component from another.

Figure 2:
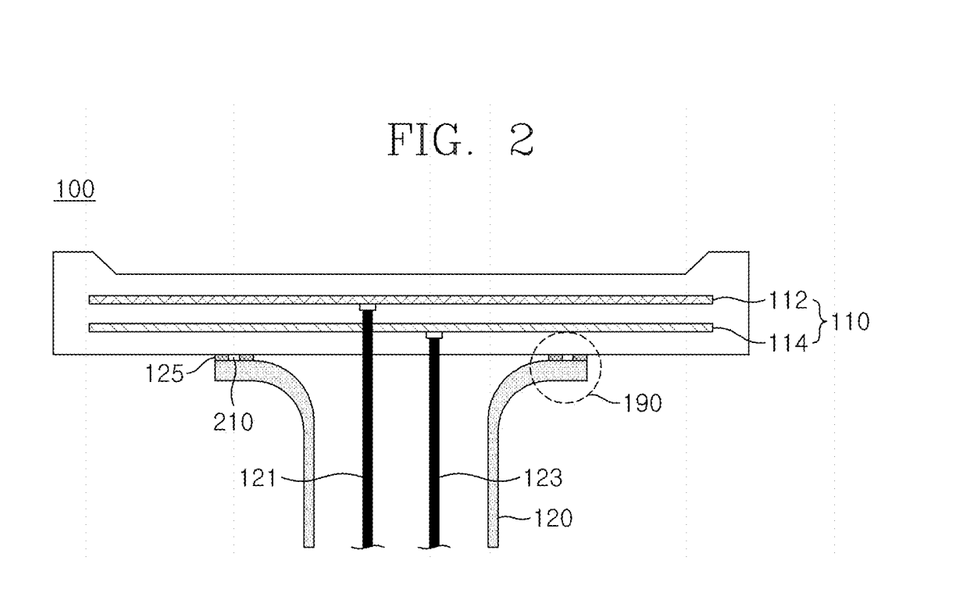
FIG. 2 is a schematic cross-sectional view of a ceramic heater according to an embodiment of the present disclosure.

FIG. 2 is a schematic cross-sectional view of a ceramic heater 100 according to an embodiment of the present disclosure.

Referring to FIG. 2, the ceramic heater 100 according to an embodiment of the present disclosure includes a heater plate 110 and a shaft 120.

The ceramic heater 100 according to an embodiment of the present disclosure is a semiconductor apparatus configured to support a substrate to be processed for various purposes, such as a semiconductor wafer, a glass substrate, or a flexible substrate, and to heat the substrate to be processed to a predetermined temperature. The ceramic heater 100 may be used in a process such as plasma-enhanced chemical vapor deposition.

The heater plate 110 may be configured such that the radio-frequency electrode 112 and (or) a heating element 114 are disposed (buried) between ceramic materials at predetermined intervals. The heater plate 110 is configured to stably support a substrate to be processed and to perform a heating process using the heating element 114 and/or a plasma-enhanced chemical vapor deposition process using the radio-frequency electrode 112. The heater plate 110 may be a plate-like structure having a predetermined shape. For example, the heater plate 110 may be a circular plate-like structure, but is not necessarily limited thereto. Here, the ceramic material may be at least one of $Al_2O_3$, $Y_2O_3$, $Al_2O_3/Y_2O_3$, $ZrO_2$, autoclaved lightweight concrete (AlC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, each ceramic powder may optionally contain about 0.1 to 10%, preferably about 1 to 5% of yttrium oxide powder.

The radio-frequency electrode 112 may be made of tungsten (W), molybdenum (Mo), silver (Ag), gold (Au), niobium (Nb), titanium (Ti), aluminum nitride (AlN), or an alloy thereof, preferably molybdenum (Mo). Via a connecting rod 121, the radio-frequency electrode 112 may be connected to a radio (RF) power supply or a ground. The radio-frequency electrode 112 has a wire-type or sheet-type mesh structure. Here, the mesh structure is a structure in the form of a mesh fabricated by making a plurality of metals arranged in a first direction and a plurality of metals arranged in a second direction cross relative to each other.

The heating element 114 may be fabricated in a plate-shaped coil shape or a flat plate shape with a heating wire (or a resistance wire). In addition, the heating element 114 may be fabricated in a multi-layer structure for precise temperature control. The heating element 114 is connected to the power supply via the connecting rod 123 in a semiconductor manufacturing process to execute a function of heating a substrate to be processed on the heater plate 110 to a predetermined constant temperature in order to perform a smooth deposition process and an etching process.

The shaft 120 has a pipe shape having a through hole and is coupled to the bottom surface of the heater plate 110. The shaft 120 may be made of the same ceramic material as the heater plate 100 and coupled to the same. Here, the ceramic material may be at least one of $Al_2O_3$, $Y_2O_3$, $Al_2O_3/Y_2O_3$, $ZrO_2$, autoclaved lightweight concrete (AIC), TiN, AlN, TiC, MgO, CaO, $CeO_2$, $TiO_2$, $B_xC_y$, BN, $SiO_2$, SiC, YAG, mullite, and $AlF_3$, preferably aluminum nitride (AlN). Furthermore, each ceramic powder may optionally contain about 0.1 to 10%, preferably about 1 to 5% of yttrium oxide powder.

The shaft 120 may be coupled to the heater plate 110 with a bonding material 125 such as ceramic paste as described below. In some cases, the shaft 120 may be mechanically coupled to the heater plate 110 by using bolts or nuts. Each of the rods 121 and 123 configured to supply power to the radio-frequency electrode 112 and/or the heating element 114 is accommodated through the through hole in the shaft 120.

When the shaft 120 and the heater plate 110 are bonded to each other with the bonding material 125, for bonding at a relatively high temperature (e.g., 1750 to 1850° C.), the bonding material 125 may be made of a binder having a composition of 90 to 97 wt % of AlN and 3 to 10 wt % of $Y_2O_3$. Alternatively, when the shaft 120 and the heater plate 110 are bonded to each other with the bonding material 125, for bonding at a relatively low temperature (e.g., 1600 to 1700° C.), the bonding material 125 may be made of a binder having a composition of 45 to 75 wt % of AlN, 10 to 20 wt % of $Al_2O_3$, 10 to 20 wt % of CaO, and 5 to 15 wt % of $Y_2O_3$.

The ceramic heater 100 according to an embodiment of the present disclosure includes an air pocket 210 provided, in particular, in a joint portion 190 in which the heater plate 110 and the shaft 120 are abutted on each other to be coupled to each other.

Figure 3:
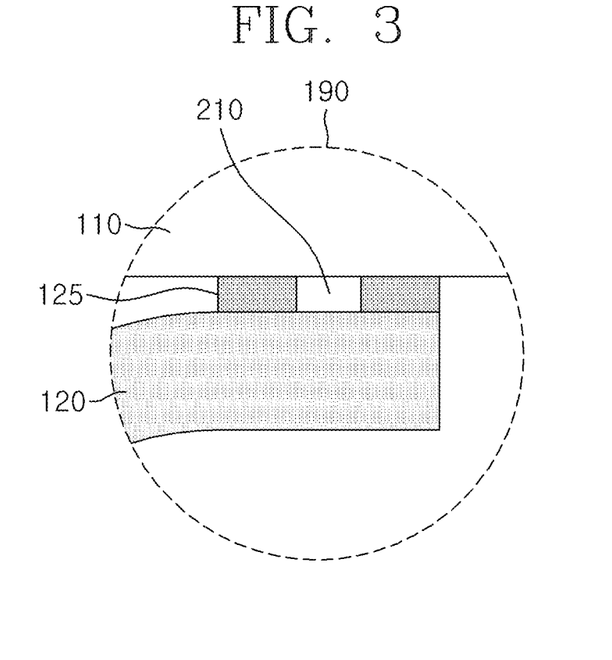
FIG. 3 is an enlarged view of the joint portion of FIG. 2.
Figure 4A:
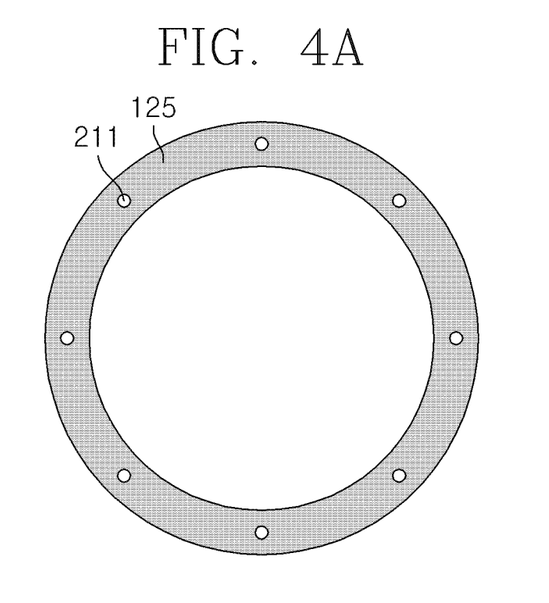
FIGS. 4A and 4B are views for explaining an air pocket provided in a bonding material in the joint portion of FIG. 2.
Figure 4B:
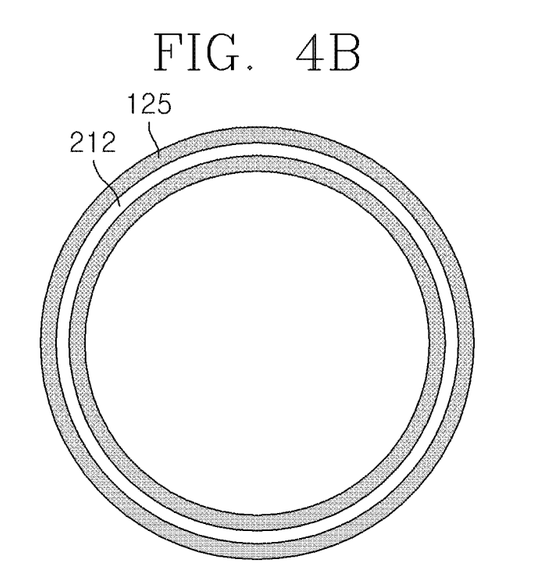

FIG. 3 is an enlarged view of the joint portion 190 of FIG. 2. FIGS. 4A and 4B are views for explaining the air pocket 210 provided in bonding materials 125 of the joint portion 190 of FIG. 2. FIGS. 4A and 4B are plan views of bonding materials 125.

Referring to FIG. 3 and FIGS. 4A and 4B, an air pocket 210 is provided in a joint portion 190 where a heater plate 110 and a shaft 120 are abutted on each other to be coupled to each other and is provided in the form of a closed loop along the joined surfaces (abutting surfaces) in the joint portion 190. As illustrated in FIGS. 4A and 4B, a ring-shaped bonding material 125 is provided along the joined surfaces in the joint portion 190 where the heater plate 110 and the shaft 120 are abutted on each other to be coupled to each other, thereby bringing the heater plate 110 and the shaft 120 into close contact with each other to be coupled. Preferably, the bonding material 125 is inserted into the space between the joined surfaces of the heater plate 110 and the shaft 120, and this will be described as an example. However, it should be noted that in some cases, when the heater plate 110 and the shaft 120 are mechanically coupled to each other by using bolts, nuts, and the like, the bonding material 125 is not necessarily required.

As illustrated in FIGS. 4A and 4B, the bonding material 125 inserted into the space between the joined surfaces to couple the heater plate 110 and the shaft 120 to each other may have a circular ring shape. Accordingly, the joined surfaces (abutting surfaces) of the heater plate 110 and the shaft 120 form a circular ring-shaped closed loop (a shape in which the joined surfaces are continuous). However, in some cases, the joined surfaces (abutting surfaces) of the heater plate 110 and the shaft 120 may have a closed loop shape other than a circular shape, such as a quadrangular shape, various polygonal shapes, or a curved shape.

As illustrated in FIGS. 4A and 4B, the air pocket 210 provided in the bonding material 125 in the joint portion 190 is a groove (or a through hole) provided along the bonding material 125 and is a cavity (empty) shape that forms a step having a thickness different from the surrounding portion.

Such an air pocket 210 includes one configured with intermittent grooves 211 as illustrated in FIG. 4A. The groove 211 may have a circular shape, a rectangular shape, or other polygonal shapes. Preferably, the intermittent grooves 211 are spaced apart from each other at a predetermined equal interval. However, when the joined surfaces of the heater plate 110 and the shaft 120 form a closed loop such as an irregular polygonal shape or a curved shape, the intervals between the grooves 211 do not need to be constant and equal intervals, and the intervals of the groves 211 may be set to appropriate ones so that there is no vacuum leaking.

In addition, as illustrated in FIG. 4B, the air pocket 210 includes one configured with a continuous groove 212. Just as the joined surfaces (abutting surfaces) of the heater plate 110 and the shaft 120 form a ring-shaped closed loop, the air pocket 210 may be configured with a continuous groove 212 in the form of a ring-like closed loop.

Figure 5A:
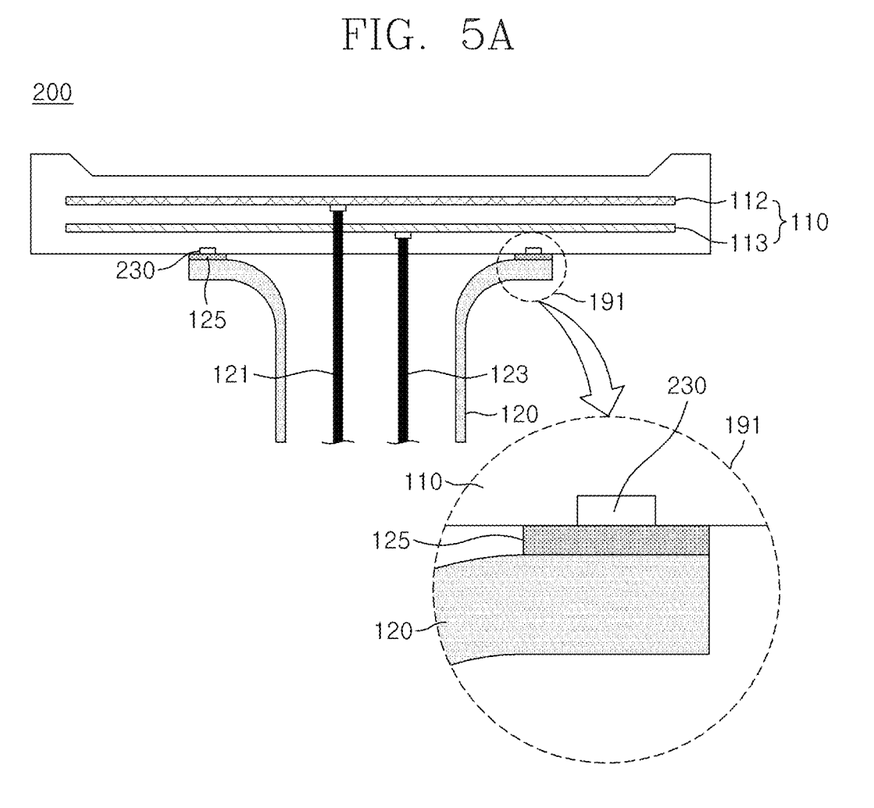
FIG. 5A illustrates a schematic cross-sectional view of a ceramic heater according to another embodiment of the present disclosure and an enlarged view of the joint portion.
Figure 5B:
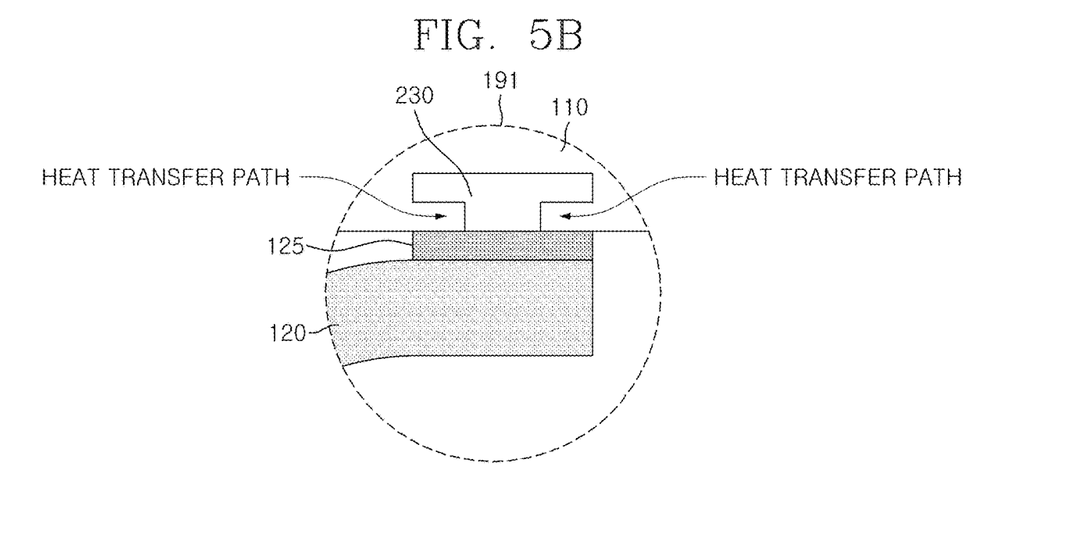
FIG. 5B illustrates another embodiment of an air pocket in the joint portion of FIG. 5A.

FIG. 5A illustrates a schematic cross-sectional view of a ceramic heater 200 according to another embodiment of the present disclosure and an enlarged view of a joint portion 191. FIG. 5B is another embodiment of the air pocket 230 in the joint portion 191 of FIG. 5A.

Referring to FIGS. 5A and 5B, in a ceramic heater 200 according to another embodiment of the present disclosure, the shapes and configurations a joint portion 191 in which a heater plate 110 and a shaft 120 are coupled to each other and an air pocket 230 provided in the joint portion 191 are slightly different from those of the joint portion 190 and the air pocket 210 provided in the joint portion 190 in FIG. 2. The shapes and configurations of other components in the ceramic heater 200 according to another embodiment of the present disclosure are similar to those of FIG. 2. The structure of the joint portion 190 of FIG. 2 may be used in combination with the joint portion 191 of FIGS. 5A and 5B.

In the ceramic heater 200 according to another embodiment of the present disclosure, the air pocket 230 is provided in the joint portion 191 in which the heater plate 110 and the shaft 120 are abutted on each other to be coupled to each other and may be provided along the joined surfaces in the joint portion 191 which form a closed loop. A ring-shaped bonding material 125 (see FIG. 4) is provided along the joined surfaces in the bonding portion 191 in which the heater plate 110 and the shaft 120 are abutted on each other to be coupled to each other, thereby bringing the heater plate 110 and the shaft 120 into close contact with each other. It is preferable to insert the bonding material 125 into the space between the joined surfaces of the heater plate 110 and the shaft 120. However, it should be noted that in some cases, when the heater plate 110 and the shaft 120 are mechanically coupled to each other by using bolts, nuts, and the like, the bonding material 125 is not necessarily required.

As illustrated in FIG. 5A, the air pocket 230 in the ceramic heater 200 according to another embodiment of the present disclosure includes a groove formed in the heater plate 110 along the joined surfaces in the bonding portion 191. That is, the groove-shaped air pocket 230 provided along the joined surfaces in the bonding portion 191 on the bottom surface of the heater plate 110 is a cavity (empty) space forming a step having a thickness different from that of the surrounding portion.

In the air pocket 230 in the ceramic heater 200 according to another embodiment of the present disclosure, the shape of the groove may have a rectangular shape, a circular shape, or the like in cross section, and in order to further reduce heat loss, the groove may have a T shape in its vertical cross section, as illustrated in FIG. 5B. That is, the T-shaped groove constituting the air pocket 230 may have a width wider toward the heater plate 110 than a narrow width on the side of the bonding surface. As a result, the heat transfer path toward the bonding material 125 may be increased so heat dissipation can be reduced and heat loss can be minimized.

Figure 6A:
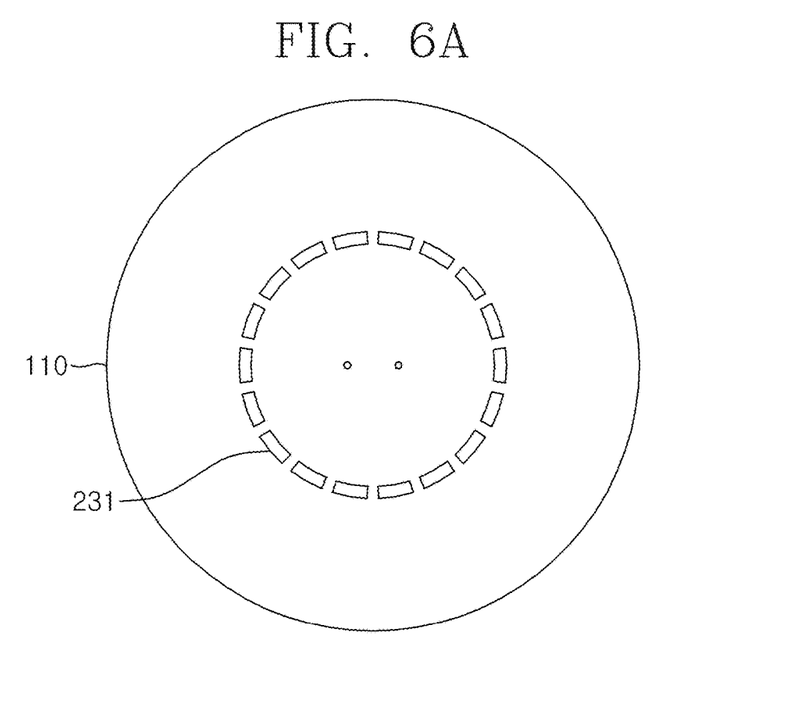
FIGS. 6A and 6B are bottom views of heater plates for explaining air pockets provided in the heater plates of FIGS. 5A and 5B.
Figure 6B:
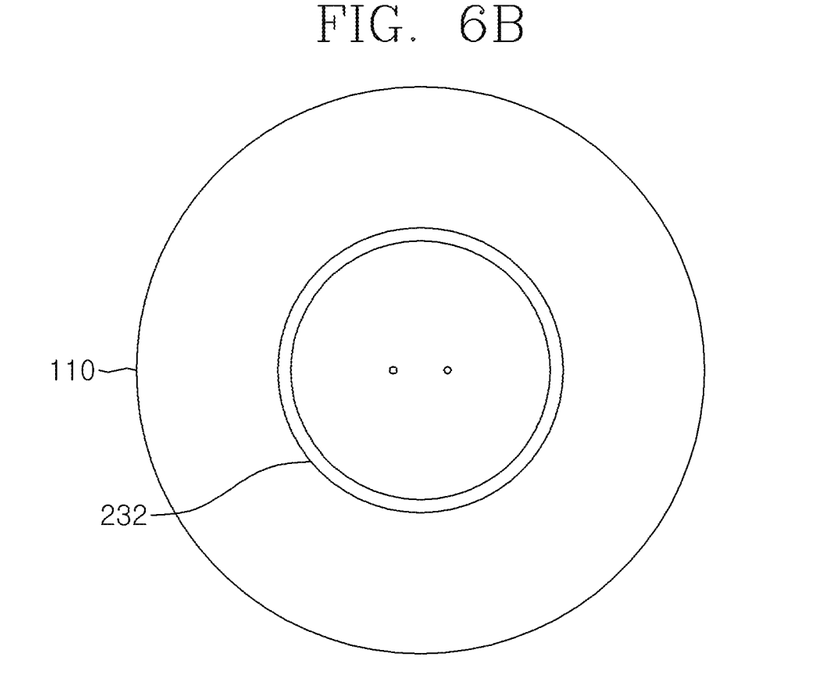

FIGS. 6A and 6B are bottom views of heater plates 110 for explaining air pockets 230 formed in the heater plates 110 of FIGS. 5A and 5B. FIG. 6A illustrates that an air pocket 230 provided in the heater plate 110 is configured with intermittent grooves 231, and FIG. 6B illustrates that an air pocket 230 provided in the heater plate 110 is configured with a continuous groove 232.

The grooves 231 of the air pocket 230 configured with the intermittent grooves 231 as illustrated in FIG. 6A may have a circular shape, a quadrilateral shape, other polygonal shapes, or the like in horizontal cross-section. Preferably, the intermittent grooves 231 are spaced apart from each other at a predetermined equal interval. However, when the joined surfaces of the heater plate 110 and the shaft 120 form a closed loop such as an irregular polygonal shape or a curved shape, the intervals between the grooves 231 do not need to be constant and equal intervals, and the intervals of the groves 231 may be set to appropriate ones so that there is no vacuum leaking.

In addition, the groove 232 of the air pocket 230 configured with the continuous groove 232 as illustrated in FIG. 6B has a closed loop shape in horizontal cross section in the same way that the joined surfaces (abutting surfaces) of the heater plate 110 and the shaft 120 form a closed loop.

Figure 7A:
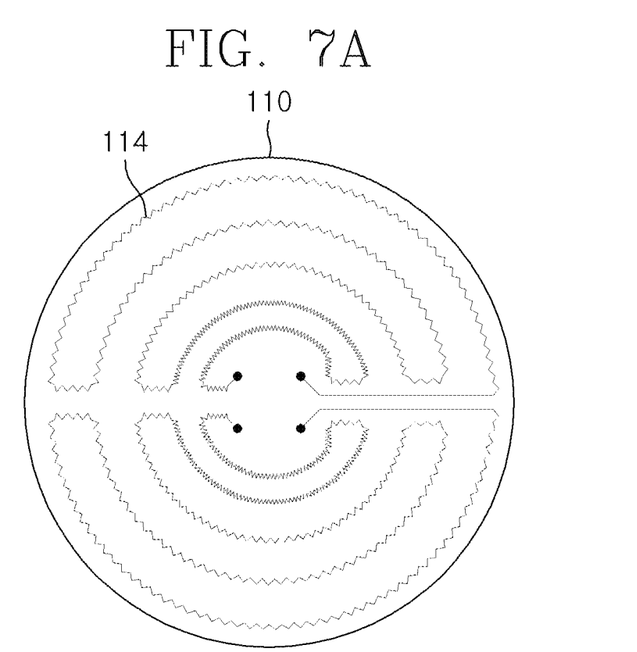
FIGS. 7A, 7B and 7C is a view for explaining an air pocket provided in an arrangement path of a heating element in a ceramic heater according to embodiments of the present disclosure.
Figure 7B:
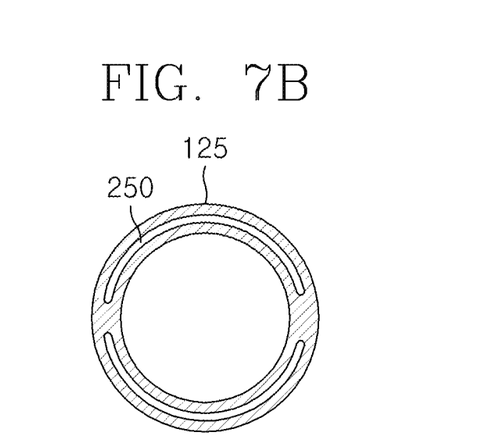
Figure 7C:
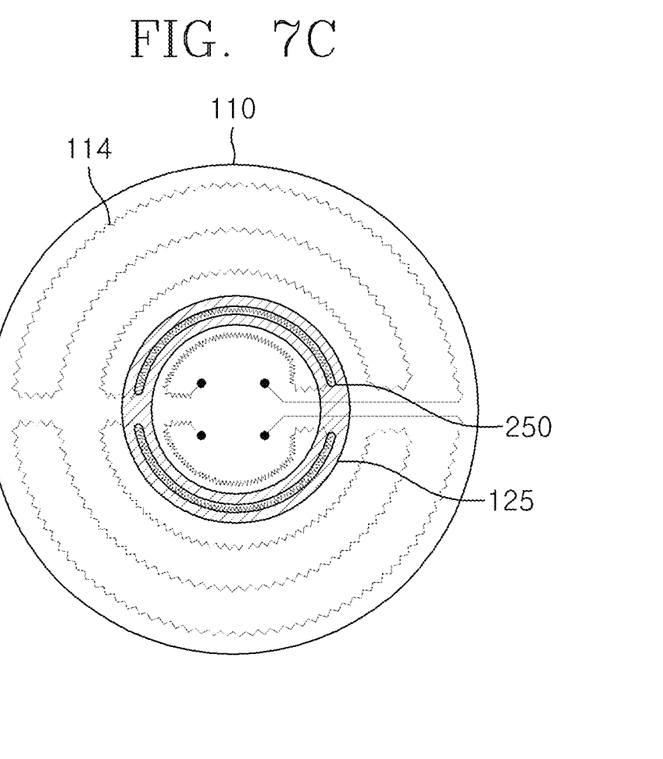

FIG. 7A to 7C is a view for explaining an air pocket 250 provided in an arrangement path of a heating element 114 in a ceramic heater 100 or 200 according to embodiments of the present disclosure.

FIG. 7A illustrates an example of an arrangement shape of heating elements 114 disposed in the ceramic material of the heater plate 110. FIG. 7B illustrates that a groove-shaped air pocket 250 in the bonding material 125 to be inserted into the space between joined surfaces where the heater plate 110 and the shaft 120 are bonded to each other is provided on a path corresponding to a path along which the heating elements 114, such as resistance wires, are arranged. FIG. 7C illustrates a figure obtained by overlapping FIG. 7A and FIG. 7B.

Like the air pocket 250 provided on the path corresponding to the path along which the heating elements 114 are arranged as illustrated in FIGS. 7A, 7B and 7C, the air pocket 210 or 230 in the ceramic heater 100 or 200 of the embodiments of the present disclosure may be provided on a path corresponding to the path along which the heating elements 114, such as resistance wires, are arranged.

Here, the air pocket 250 includes an air pocket, which is provided along the bonding material 125 inserted into the space between the joined surfaces of the heater plate 110 and the shaft 120 in the joint portion 125 as illustrated in FIG. 2. In addition, the air pocket 250 includes an air pocket provided in the ceramic material of the heater plate 110 along the joined surfaces in the joint portion 191, as illustrated in FIGS. 5A and 5B.

The path where the heating elements 114, such as resistance wires, are arranged as described above is a main heating portion where a lot of heat is generated. Thus, by placing the air pocket 250 of the present disclosure, it is possible to reduce heat conduction transferred toward the shaft 120 from the heater toward so that the loss of heat dissipated toward the shaft 120 can be reduced.

In the ceramic heater 100 or 200 according to the embodiments of the present disclosure, the thermal conductivities of the heater plate 110 and the bonding material 125 were about 150 to 170 W/mK, and the thermal conductivity of the shaft 120 was about 80 to 170 W/mK. In contrast, the thermal conductivity of the air pocket 210 or 230 was about 0.025 W/mK.

When the ceramic heater 100 or 200 is used to perform a deposition process, an etching process, and the like on a substrate to be processed on the heater plate 110, the high temperature heat generated in the heater plate 110 by the heating element 114 dissipates through a heat transfer path through which heat transfers to the shaft 120 via the bonding material 125. Therefore, since the thermal conductivity of the air pocket 210 or 230 described above is much smaller than those of the heater plate 110 and the shaft 120, it is possible to reduce the loss of heat dissipated through the heat transfer path through which heat transfers from the heater plate 110 to the shaft 120.

Furthermore, for example, when the air pocket 210 or 230 is configured with intermittent grooves 211 or 231 or a continuous groove 212 or 232 as illustrated in FIG. 4A or FIG. 4B and/or FIG. 6A or FIG. 6B, it is possible to reduce cracking around the joint portion 190 or 191 by reducing thermal stress generated due to a temperature difference, compared to the conventional case without the air pocket 210. That is, in the conventional structure, a large amount of heat is transferred and dissipated between the heater plate 110 and the shaft 120, and the temperature difference between the heater plate 110 and the shaft 120 around the joint portion 190 or 191 is large. As a result, thermal stress may be increased, and thus cracking in the heater plate 110 and the shaft 120 may be increased. In contrast, since the thermal conductivity of the air pockets 210 or 230 is much smaller than those of the heater plate 110 and the shaft 120, it is possible to reduce the heat transfer from the heater plate 110 to the shaft 120 accordingly, and since the temperature difference between the heater plate 110 and the shaft 120 around the joint portion 190 or 191 is reduced, and thus thermal stress is reduced, it is possible to reduce cracking in the heater plate 110 and the shaft 120.

Furthermore, even when the area of the bonding material abutting on binding surfaces in the conventional structure without the air pockets 210 or 230 of the present disclosure and the area of the bonding material 125 abutting on the joined surfaces in the structure using the bonding material 125 of the present disclosure of which the width is split into two portions by the groove 211 or 231 or 212 or 232) for the air pocket 210 or 230 (the sum of the areas split into two portions) are designed to be equal to each other, the structure using the air pockets 210 or 230 of the present disclosure is able to reduce vacuum leaking such that gas leakage is reduced. That is, when a deposition process and an etching process are performed on a substrate to be processed on the heater plate 110 in a chamber of a semiconductor apparatus, the empty space inside the shaft 120 is in an air atmosphere, and the surrounding area of the heater plate 110 within the chamber is in a predetermined vacuum atmosphere. Therefore, even if the bonding material 125 inserted into the space between the joined surfaces abutted on each other is present in the joint portion 190 or 191 of the heater plate 110 and the shaft 120, there is some vacuum leaking. Therefore, as in the present disclosure, when the air pocket 210 or 230 is applied, the gas leakage path is increased accordingly by the length in which the gas inside the apparatus passes through the bonding material 125 of the joined surfaces or the air pocket 230 in the heater plate 110. As a result, there is an effect of reducing gas leakage to reduce vacuum leaking and to maintain a high vacuum.

In addition, as described in the description made with reference to FIG. 5B, in order to further reduce heat loss, the T-shaped groove constituting the air pocket 230 is configured to have a width wider toward the heater plate 110 than a narrow width on the side of the joined surfaces. Accordingly, as illustrated in FIG. 5B, since a heat transfer path toward the bonding material 125 is increased, it is possible to reduce heat dissipation and to minimize heat loss.

As described above, in the ceramic heater 100 or 200 according to the present disclosure, by placing the air pocket 210 or 230 in the joint portion 190 or 191 between the heater plate 110 and the shaft 120, it is possible to reduce heat loss. The air pocket 210 or 230 is capable of increasing thermal efficiency by reducing leaking in the chamber of a semiconductor apparatus, reducing cracking due to a decrease in thermal stress, and reducing a heat loss path.

As described above, the present disclosure has been described with reference to specific details such as specific components and limited embodiments and drawings. However, the description is provided only to help a more general understanding of the present disclosure, and the present disclosure is not limited to the above-described embodiments. A person ordinarily skilled in the art to which the present disclosure pertains may make various modifications and variations without departing from the essential features of the present disclosure. Therefore, the spirit of the present disclosure is not limited to the described embodiments, and not only the appended claims, but also all technical ideas equivalent to the claims or having modifications equivalent to the claims are to be interpreted as being included in the scope of the present disclosure.

What is claimed is:

1. A ceramic heater comprising:
   a heater plate made of a ceramic material on which a heating element is disposed;
   a tubular shaft having a through hole, wherein the shaft is coupled to a bottom surface of the heater plate and accommodates a rod configured to supply power to the heating element through the through hole; and
   a continuous or intermittent air pocket provided in a joint portion where the heater plate and the shaft are abutted on each other to be coupled to each other,
   wherein the air pocket is provided along joined surfaces in the joint portion, the air pocket includes a groove provided in the heater plate along the joined surfaces of the joint portion at a bent portion of an upper end of the shaft for joining the heater plate, wherein the groove is provided wider toward the heater plate than toward the joined surfaces.

2. The ceramic heater of claim 1, further comprising:
   a bonding material provided between the heater plate and the shaft along the joined surfaces in the joint portion,
   wherein the air pocket includes a groove provided along the bonding material.

3. The ceramic heater of claim 2, wherein the bonding material contains 90 to 97 wt % of AlN and 3 to 10 wt % of $Y_2O_3$.

4. The ceramic heater of claim 2, wherein the bonding material contains 45 to 75 wt % of AlN, 10 to 20 wt % of $Al_2O_3$, 10 to 20 wt % of CaO, and 5 to 15 wt % of $Y_2O_3$.

5. The ceramic heater of claim 1, wherein the groove has a T-shaped cross section and is wider toward the heater plate than toward the joined surfaces.

6. The ceramic heater of claim 1, wherein the air pocket is provided at a position corresponding to an arrangement path of the heating element along the arrangement path of the heating element.

7. The ceramic heater of claim 6, further comprising:
   a bonding material provided between the heater plate and the shaft along the joined surfaces in the joint portion, and
   the air pocket is provided along the bonding material.

8. The ceramic heater of claim 1, wherein the heater plate further comprises a radio-frequency electrode which is spaced apart from the heating element, and
   the radio-frequency electrode is configured to receive power through another rod provided in the through hole in the shaft.

* * * * *